United States Patent
Fu et al.

(10) Patent No.: US 7,112,534 B2
(45) Date of Patent: Sep. 26, 2006

(54) PROCESS FOR LOW K DIELECTRIC PLASMA ETCHING WITH HIGH SELECTIVITY TO DEEP UV PHOTORESIST

(75) Inventors: Qiang Fu, Portland, OR (US); James Jeong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 10/672,357

(22) Filed: Sep. 25, 2003

(65) Prior Publication Data

US 2005/0070116 A1    Mar. 31, 2005

(51) Int. Cl.
*H01L 21/302* (2006.01)

(52) U.S. Cl. ............ 438/708; 438/709; 438/717; 438/725

(58) Field of Classification Search ........ 438/708, 438/709, 717, 725
See application file for complete search history.

(56) References Cited

U.S. PATENT DOCUMENTS

| 6,080,680 A * | 6/2000 | Lee et al. ............... 438/727 |
| 6,730,454 B1 * | 5/2004 | Pfeiffer et al. ............ 430/270.1 |
| 6,833,325 B1 * | 12/2004 | Huang et al. ............... 438/714 |
| 6,869,542 B1 * | 3/2005 | Desphande et al. ........... 216/51 |
| 6,967,171 B1 * | 11/2005 | Fujimoto et al. ............ 438/714 |

\* cited by examiner

*Primary Examiner*—Nadine G. Norton
*Assistant Examiner*—Binh X. Tran
(74) *Attorney, Agent, or Firm*—Kathy J. Ortiz (57) ABSTRACT

A method of forming a microelectronic structure and its associated structures is described. That method comprises forming and patterning a deep uv resist layer on a substrate, etching the substrate in a plasma generated from a gas comprising a carbon to fluorine ratio from about 1:1 to about 2:3 to form substantially vertical sidewalls in the deep uv resist layer.

12 Claims, 7 Drawing Sheets

PROCESS FOR LOW K DIELECTRIC PLASMA ETCHING WITH HIGH SELECTIVITY TO DEEP UV PHOTORESIST

FIELD OF THE INVENTION

The present invention relates to the field of microelectronic processing, and more particularly to methods of processing a resist layer in the fabrication of integrated circuits, and structures formed thereby.

BACKGROUND OF THE INVENTION

Figure 3A:
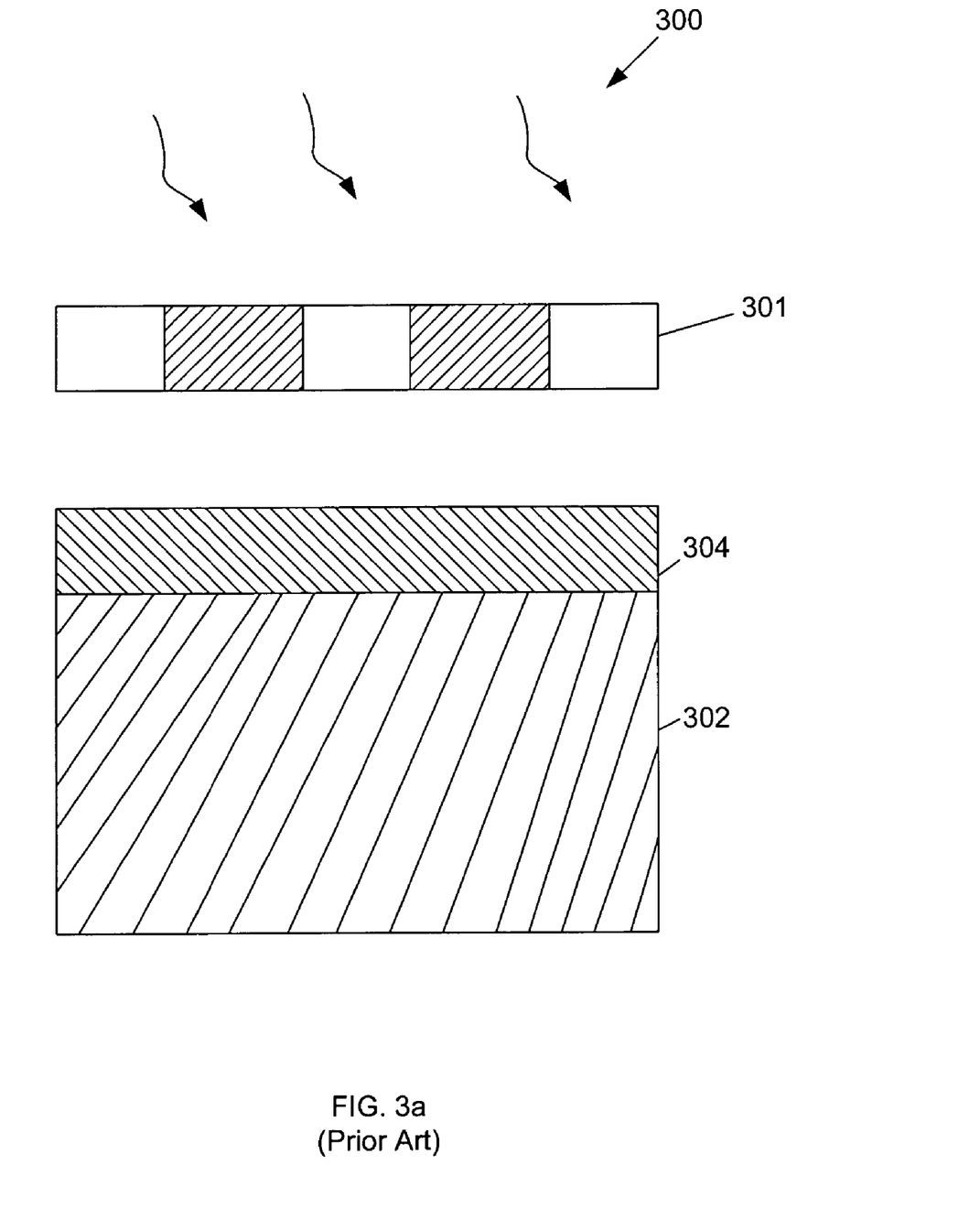
FIGS. 3a–3c represent cross-sections of structures in the Prior Art.
Figure 3B:
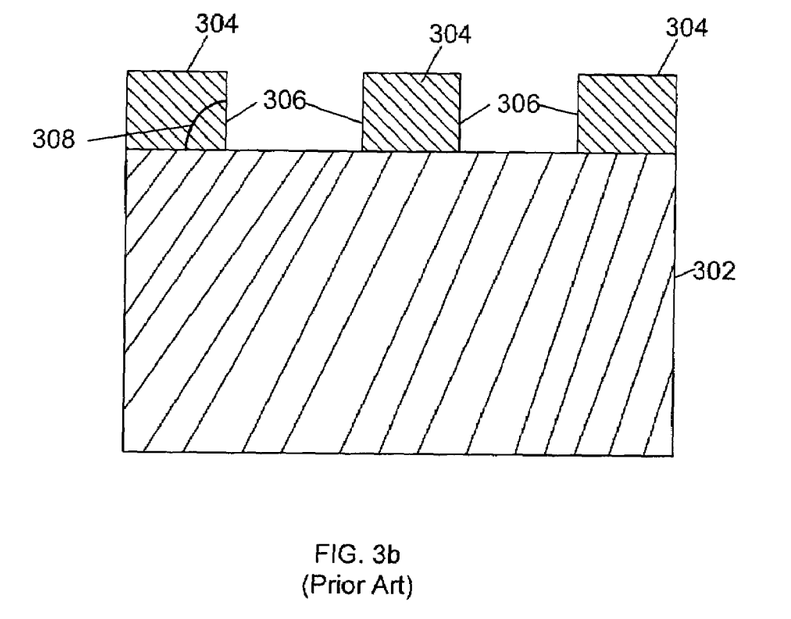

Resist layers (sometimes called photoresist layers to imply the lithographic processes typically used with them) are frequently used to generate masks during the fabrication of integrated circuits. Typically, a layer of resist material 304 is deposited on the surface of an underlying layer 302 to be patterned, and then the resist layer 304 is exposed to light 300 that is passed through an exposure pattern 301 (see FIG. 3a). The resist material 304 is processed in such a way that the exposed portions of the resist material 304 (or alternately the non-exposed portions) are removed, so that the remaining resist material 304 forms a mask in the shape of the exposure pattern (See FIG. 3b). The patterned resist material 304 includes sidewalls 306 that serve to define circuit features in the underlying layer 302. The sidewalls 306 include a pre-etch sidewall angle 308, that is typically about 90 degrees.

Figure 3C:
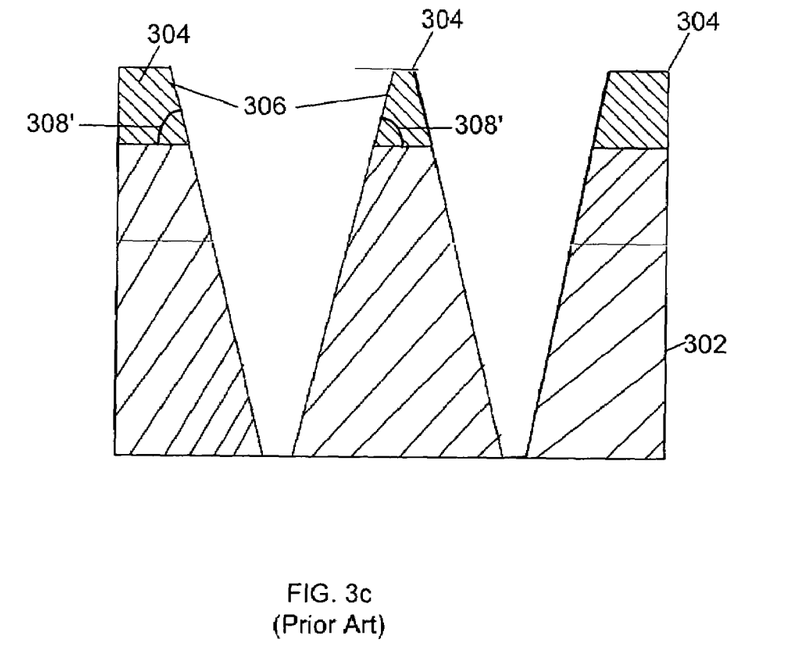

The areas of underlying layer 302 that are not directly covered by the resist material 304 are removed through an etch process, such as a plasma etch, with the mask of resist material 304 preventing removal of those portions of the underlying material that are directly under the resist material 304 (FIG. 3c). Because an etch is a destructive process, the etch may cause deterioration of the resist material 304. This deterioration may uncover additional portions of the underlying material 302 before the etch is complete, thereby etching portions of the underlying material 302 that were intended to be protected from the etch process.

The deterioration is typically greatest at the sidewalls 306 of the resist material 304, i.e., a post-etch sidewall angle 308' of the sidewalls 306 is less than the pre-etch sidewall angle 308 of the sidewall 306, which results in a sloped resist sidewall 306. Circuit features, such as trenches, that may be etched in a substrate, for example, a low k dielectric material, may exhibit significant sloping because the sidewalls 306 of the resist material 304 that define those features are unintentionally etched away (FIG. 3c). If not treated carefully, excessive resist sloping during plasma etching can cause shorting (because the sloped angle of the resist mask is transferred to the circuit feature) between features such as between metal lines or between trenches, for example, which can leading to device failure.

In addition, resist material that is designed for exposure to light with a wavelength of approximately 193 nanometers (which is commonly used for sub 0.13 micron circuit features) is particularly susceptible to deterioration during the plasma etch. To improve etch resistance, one common approach is to increase the carbon-to-hydrogen ratio in the resist material while maintaining its transparency to exposure light. Several available options have been utilized, such as multi-ringed aliphatic groups, poly methyl methacrylate, or cyclo olefin-maleic anhydride copolymer platforms. However, these approaches have limited success in achieving etch resistance comparable with 248 nm resist, which is commonly used for circuit features greater than about 0.13 microns.

Therefore, there is a need for improved methods of plasma etching that reduce the deterioration of deep ultraviolet (uv) resist material, such as 193 nm resist material, so that underlying features do not exhibit sloping which can lead to device failure. The present invention provides such methods and their associated structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 2a represents a flowchart of a method according to an embodiment of the

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a microelectronic structure and its associated structures are described. Those methods comprise forming and patterning a deep uv resist layer on a substrate, and etching the substrate in a plasma generated from a gas comprising a carbon to fluorine ratio from about 1:1 to about 2:3 to form substantially vertical sidewalls in the deep uv resist layer.

Figure 1A:
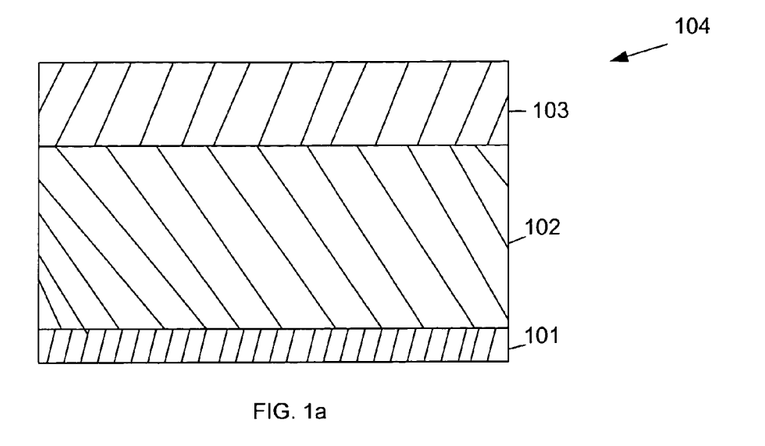
FIGS. 1a–1f represent cross-sections of structures that may be formed when carrying out an embodiment of the method of the present invention.

FIGS. 1a–1f illustrate an embodiment of a method of fabricating a microelectronic structure according to the present invention. FIG. 1a illustrates a portion of a substrate 104, that may comprise an etch stop layer 101. The etch stop layer 101 may comprise a material such as silicon carbide or silicon nitride, for example.

A dielectric layer 102 may be disposed on the etch stop layer 101 of the substrate 104. The dielectric layer 102 may including but is not limited to silicon dioxide, silicon nitride, silicon oxynitride, and the like. The dielectric layer 102 may also preferably comprise a low k dielectric material, in which the dielectric constant of the low k dielectric layer is below about 4. Examples of such a low k dielectric material may include but are not limited to carbon doped oxide, organic polymers such as a polyimide, parylene, polyarylether, organo-silicone, polynaphthalene, polyquinoline, or copolymers thereof, spin on glass materials, either doped or undoped, or porous materials such as xerogels and others that include templated pores.

A sacrificial light absorbing layer 103 may be disposed on the dielectric layer 102 of the substrate 104. The sacrificial light absorbing layer 103 may including but is not limited to a spin-on-polymer (SOP) or spin-on-glass (SOG) combined with a dye. The organic or inorganic material chosen for the dye preferably should absorb light that is used during the exposure step of the photolithographic patterning process, which improves the process control of feature definition values, such as critical dimension values (i.e., CD's) as are well known in the art. For example, the dye type and amount, and the type of base material, used to form the sacrificial light absorbing layer 103 may be selected and tuned to absorb deep ultraviolet or shorter, wavelengths (e.g., a wavelength below about 200 nm), The sacrificial light absorbing layer 103 may be formed on the dielectric layer 102 by spin coating the sacrificial light absorbing layer 103 using conventional process steps known in the art. It will be understood that the substrate 104 may comprise other materials commonly used in microelectronic manufacturing, and that the etch stop layer 101, the dielectric layer 102 and the sacrificial light absorbing layer 103 may be substituted for other layers depending on the application.

Figure 1B:
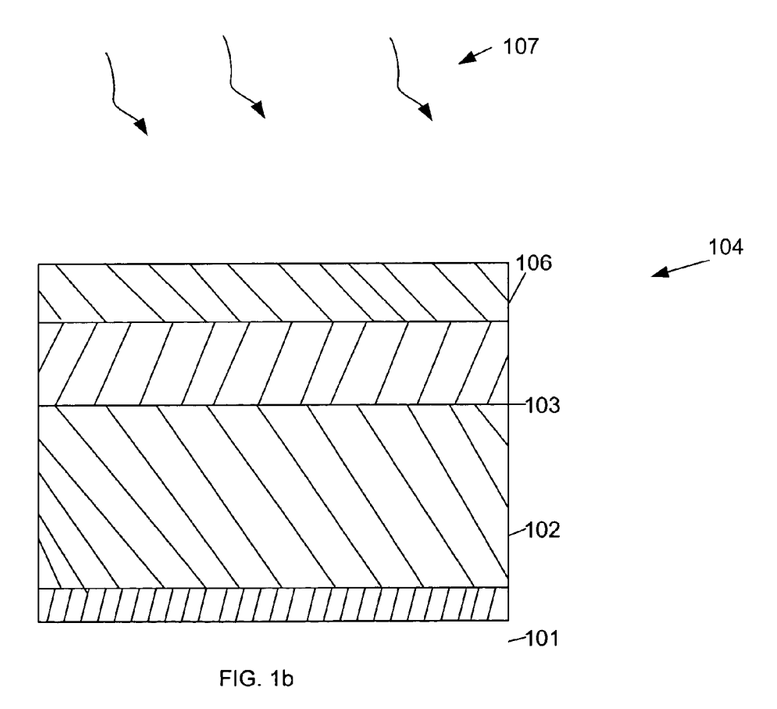

As shown in FIG. 1b, a deep uv resist layer 106 may be formed on the sacrificial light absorbing layer 103 of the substrate 104, utilizing methods known in the art, that will not be described further herein. The deep uv resist layer 106 may include material selected for lithographic exposure to light 107 in the deep ultraviolet range (e.g., with a wavelength of less than approximately 200 nm), such as 193 nm, as is well known to those skilled in the art. In the current embodiment, the deep uv resist layer 106 may comprise an acrylic polymer (e.g., at least one of acrylate, methacrylate, acrylate with a methyl group on backbone, acrylate-methacrylate copolymers, etc.), but other embodiments may use other materials. The deep uv resist layer 106 may be about 2100 to about 3,000 angstroms in thickness.

Figure 1C:
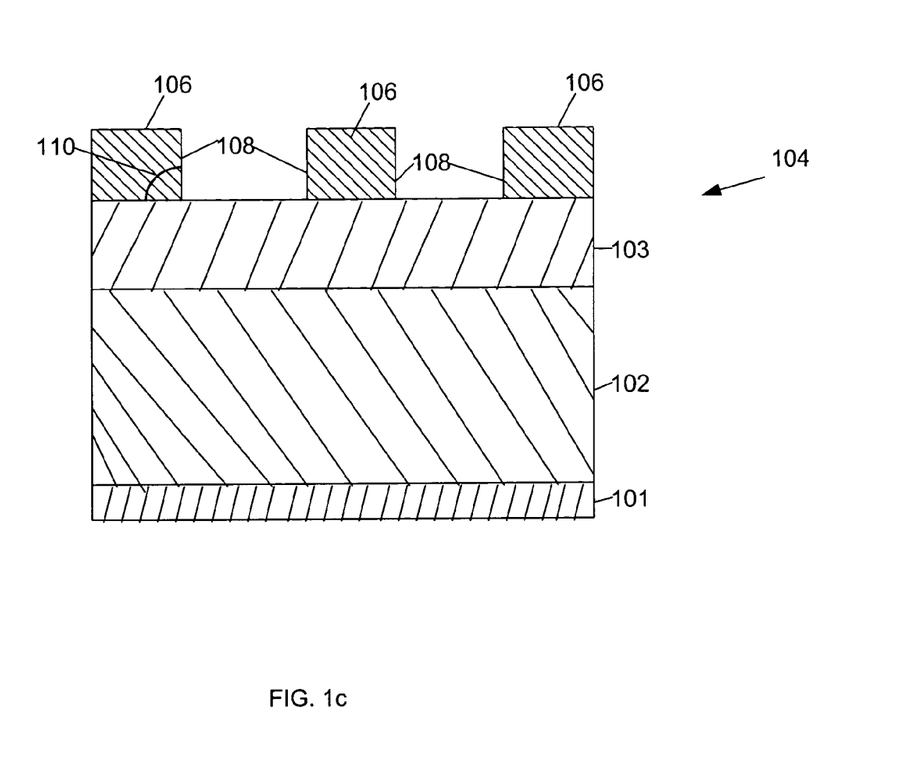

The deep uv resist layer 106 is then patterned utilizing methods well known in the art (FIG. 1c). The pattern serves as a shape template that will be transferred to those underlying layer(s) that are desired to be patterned according to the patterned deep uv resist layer 106, such as the sacrificial light absorbing layer 103 and the dielectric layer 102. The patterned deep uv resist layer 106 comprises a sidewall 108, that includes a pre-etch sidewall angle 110. The pre-etch sidewall angle 110 is typically about 90 degrees after patterning the deep uv resist layer 106.

An etch may be performed on the substrate 104 by exposing the substrate to a plasma utilizing a gas comprising a carbon atom to fluorine atom ratio of between about 1:1 to about 2:3. By illustration and not limitation, such a gas may comprise hexafluorobutane (C4F6). The 1:1 to about 2:3 carbon to fluorine ratio gas may have a flow rate that is from about 10 to about 50 sccm. The plasma may also comprise an argon gas that may have a flow rate from about 100 to about 1000 sccm, and the plasma may also comprise a nitrogen gas that may have a flow from about 50 to about 1000 sccm. The plasma may be generated using conventional techniques and equipment, such as reactive ion etching (RIE), inductively coupled plasma (ICP) etc. The power may be from about 1 KW to about 4 KW. The pressure may be from about 15 to about 100 millitorr.

Figure 1D:
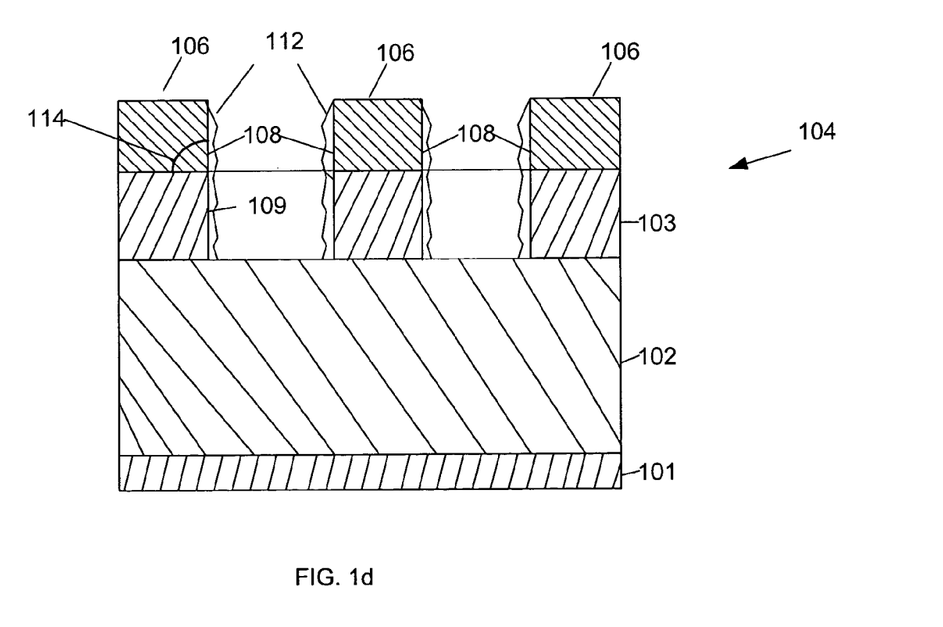

Etching the substrate 104 in the aforementioned plasma produces a polymer 112 on the sidewalls 108 of the deep uv resist layer 106 as well as on the substrate sidewalls 109, shown in FIG. 1d. The polymer 112 may form due to the re-deposition of the etch products from the substrate 104 and the deep uv resist layer 106. The carbon to fluorine atom ratio is therefore optimized (i.e., from about 1:1 to about 2:3) in the plasma to produce the polymer 112 on the sidewalls 108 of the deep uv resist layer 106, while still enabling the sufficient etching of the substrate 104, in this case the sacrificial light absorbing layer 103. The polymer 112 serves as a passivation layer that substantially prevents the etching, sloping or deterioration of the sidewalls 106 of the deep uv resist layer 106. This is because the etch rate of the polymer 112 passivated sidewall 108 is about 100 times slower than the etch rate of the substrate 104, in this case the sacrificial light absorbing layer 103.

Therefore, the pattern transferred by the deep uv resist layer 106 is not sloped as in the prior art (see FIG. 3c). As is shown in FIG. 1d, a post-etch sidewall angle 114 is approximately the same value as the pre-etch sidewall angle 110, that is, both angles are about 86 to about 90 degrees. Thus, by using a plasma comprising a gas with a carbon to fluorine ratio of about 1:1 to about 2:3, a near vertical post etch sidewall angle 114 is achieved in the patterned deep uv resist layer 106. Because the deep uv resist layer 106 transfers the vertical pattern to the substrate 104, the substrate sidewalls 109 are also substantially vertical. This results in greatly reduced shorting between circuit features.

Figure 2A:
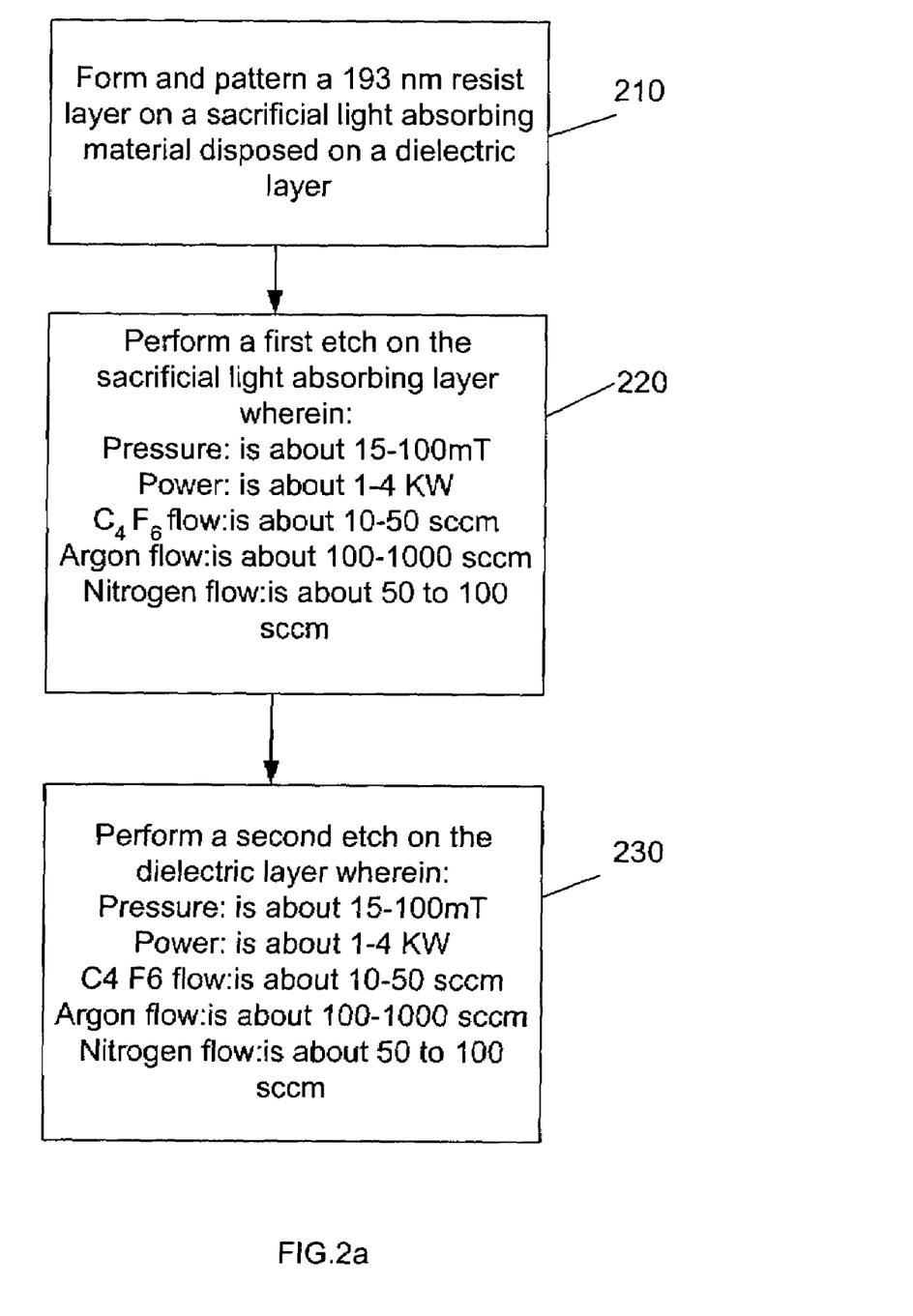

In another embodiment of the method of the present invention, as shown in step 210 of FIG. 2a, a deep uv resist layer is formed and patterned on a sacrificial light absorbing material disposed on a dielectric layer, similar to the structure shown in FIG. 1c. In step 220, a first etch may be performed on the sacrificial light absorbing layer wherein the pressure may be from about 15 to about 100 millitorr, the power may be from about 1 to about 4 KW, a C4 F6 flow rate may be from about 10 to about 50 sccm, an argon flow rate may be from about 100 to about 1000 sccm, and a nitrogen flow rate may be from about 50 to about 100 sccm. Etching of the sacrificial light absorbing layer of the current embodiment may be stopped before substantially etching the underlying dielectric layer by methods known in the art, such as by using a timed-etch, an etch stop layer, such as etch stop layer 101, or by an endpoint detection system as are known in the art.

Thus, after the first etch of step 220 a structure similar to the structure in FIG. 1d may be formed, in which a polymer, similar to the polymer 112, passivates the sidewall of the resist resulting in a substantially vertical resist sidewall, similar to the sidewall 108.

At step 230, a second etch may be performed on the dielectric layer wherein the pressure is from about 15 to about 100 millitorr, the power may be from about 1 to about 4 KW, a C4 F6 flow rate may be from about 10 to about 50 sccm, an argon flow rate may be from about 100 to about 1000 sccm, and a nitrogen flow rate may be from about 50 to about 100 sccm. Etching of the dielectric layer in the current embodiment may be stopped before substantially etching an underlying layer, such as an etch stop layer, by methods previously described herein.

Figure 1E:
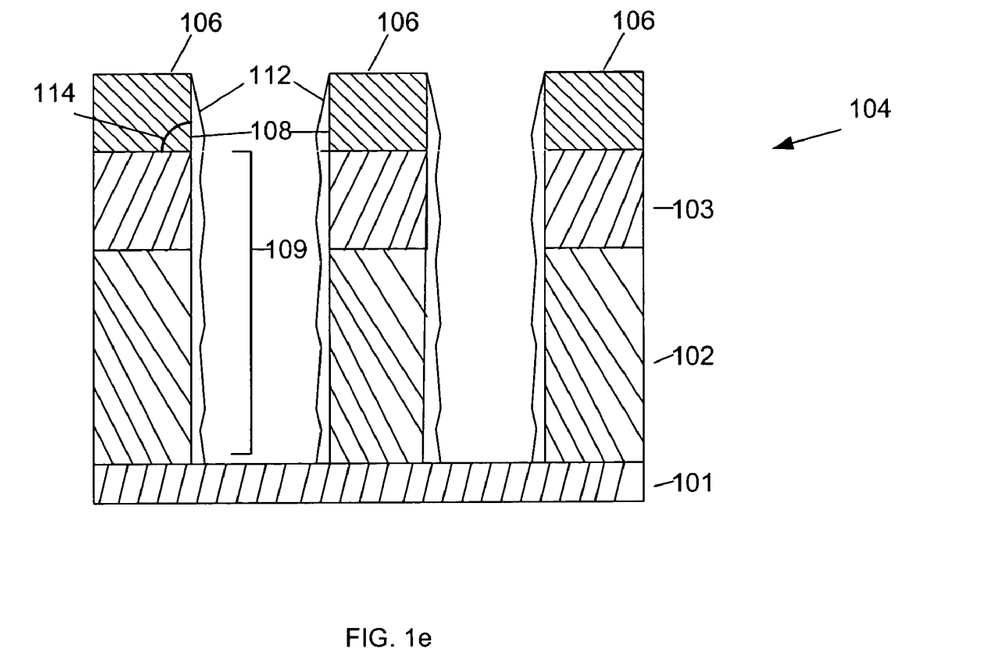

Thus, after the second etch of step 230 a structure similar to the structure in FIG. 1e may be formed, in which a polymer, similar to the polymer 112 of FIG. 1d, passivates the sidewall of the resist, similar to the deep uv resist layer 106, and also may passivate the substrate sidewall, similar to the substrate sidewall 109 of FIG. 1d. It will be understood by those skilled in the art that the polymer the deep uv resist layer 106 and the sacrificial light absorbing layer may be removed (using conventional methods known in the art) after the dielectric layer has been etched in the plasma according to the method of the current embodiment, thus creating a desired circuit feature in the substrate 104, which by illustration and not limitation, may be a trench 116, similar to the structure shown in FIG. 1f.

Figure 1F:
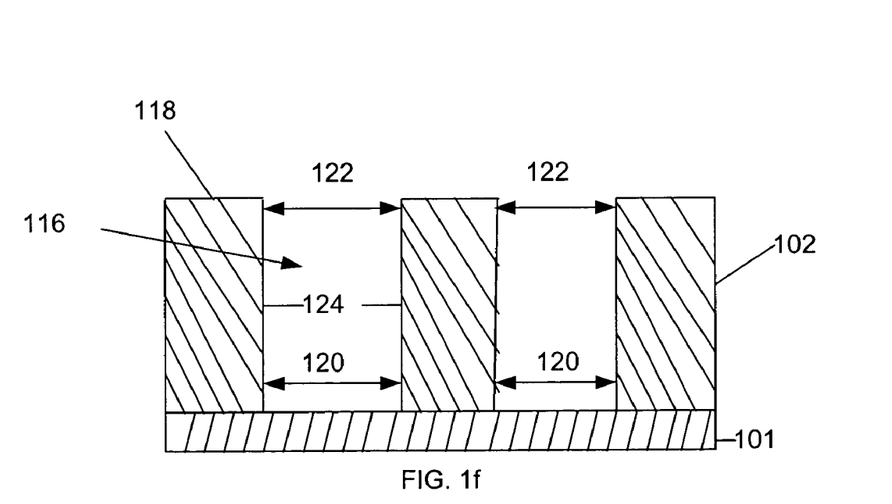

The trench 116 may comprise a first surface 118, a trench sidewall 124, a bottom width 120 and a top width 122. The ratio of the bottom width 120 to the top width 122 is preferably about 1:1, due to the sidewall 108 passivation of the deep uv resist layer 106 by the polymer 112 during the plasma etch of the current embodiment. Thus, the method of the current embodiment enables the formation of a trench 116 that comprises substantially vertical trench sidewalls 124, wherein the trench sidewalls 124 in the current embodiment comprise the dielectric layer 102.

Figure 2B:
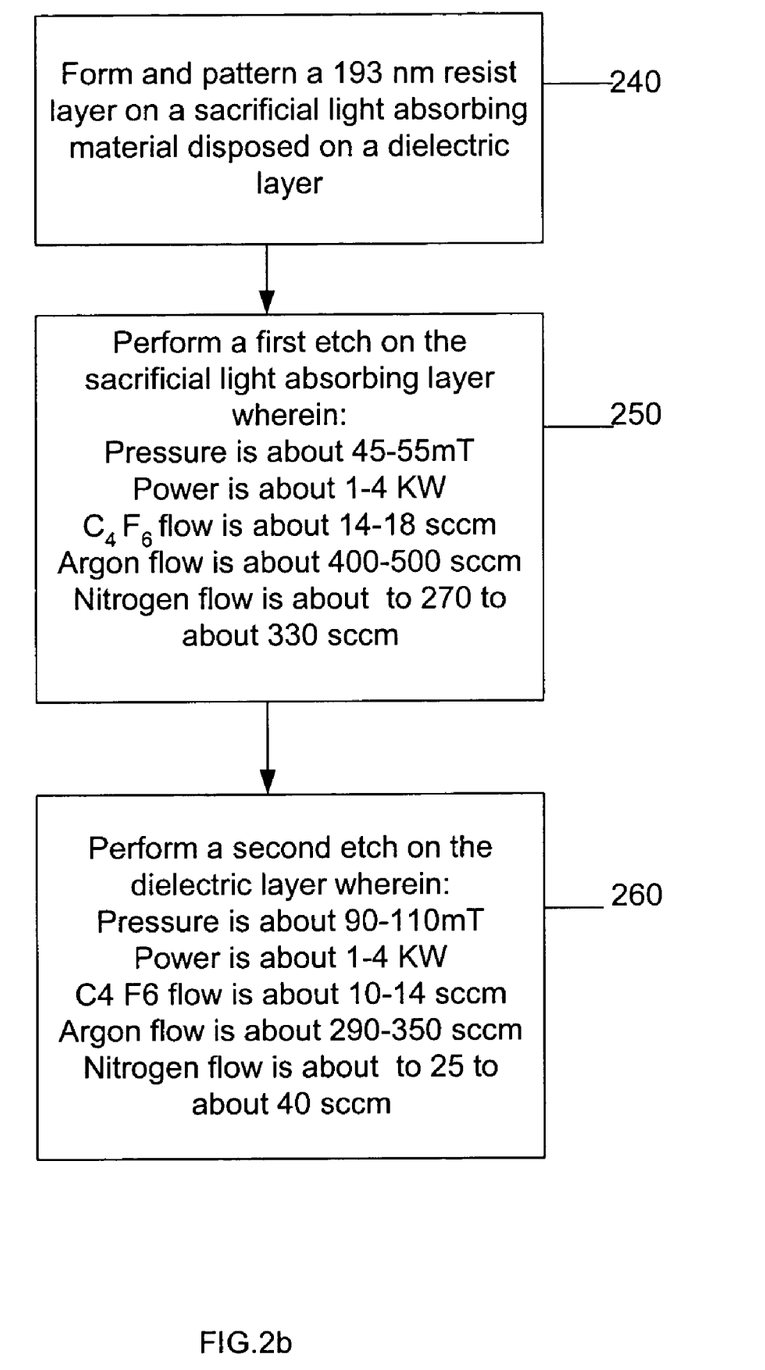
FIG. 2b represents a flowchart of a method according to an embodiment of the present invention.

In a preferred embodiment of the method of the present invention, as shown in step 240 of FIG. 2b, a deep uv resist layer is formed and patterned on a sacrificial light absorbing material disposed on a dielectric layer, similar to the structure shown in FIG. 1c. In step 250, a first etch may be performed on the sacrificial light absorbing layer wherein the pressure may be from about 45 to about 55 millitorr, the power may be from about 1 to about 4 KW, a C4 F6 flow rate may be from about 14 to about 18 sccm, an argon flow rate may be from about 400 to about 500 sccm, and a nitrogen flow rate may be from about 270 to about 330 sccm. Etching of the sacrificial light absorbing layer of the current embodiment may be stopped before substantially etching the underlying dielectric layer by methods known in the art, previously described herein. After the first etch of step 250 a structure similar to the structure in FIG. 1d may be formed, in which a polymer, similar to the polymer 112, passivates the sidewall of the resist resulting in a substantially vertical resist sidewall, similar to the sidewall 108.

At step 260, a second etch may be performed on the dielectric layer wherein the pressure is from about 90 to about 110 millitorr, the power may be from about 1 to about 4 KW, a C4 F6 flow rate may be from about 10 to about 14 sccm, an argon flow rate may be from about 290 to about 350 sccm, and a nitrogen flow rate may be from about 25 to about 40 sccm. Etching of the dielectric layer in the current embodiment may be stopped before substantially etching an underlying layer, such as an etch stop layer, by methods previously described herein.

Thus, after the second etch of step 260 a structure similar to the structure in FIG. 1e may be formed, in which a polymer, similar to the polymer 112, passivates the sidewall of the resist, similar to the sidewall 108 of the deep uv resist layer 106. The polymer, the deep uv resist layer 106 and the sacrificial light absorbing layer may be removed (as previously described herein) after the dielectric layer has been etched in the plasma according to the method of the preferred embodiment, thus creating a desired circuit feature in the substrate 104, that may be a trench 116, similar to the structure shown in FIG. 1f. Thus, the method of the preferred embodiment enables the formation of a trench 116 that comprises substantially vertical trench sidewalls 124.

As described above, the present invention provides methods and associated structures of forming and patterning a deep uv resist layer, such as a 193 nm resist layer, on a substrate, etching the substrate in a plasma generated from a gas comprising a carbon to fluorine ratio from about 1:1 to about 2:3 to form substantially vertical sidewalls in the deep uv resist layer. The methods and structures of the present invention enable the use of deep ultraviolet resists, such as 193 nm resist, by preventing the deep uv resist degradation in a plasma etch, thus greatly reducing shorting between adjacent device features and therefore enhancing the performance and reliability of a device fabricated according to the various embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple layer structure atop a substrate, such as a silicon substrate, to manufacture a microelectronic device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming a microelectronic structure comprising:
    forming and patterning a deep uv resist layer on a sacrificial light absorbing layer disposed on a dielectric layer;
    etching the sacrificial light absorbing layer in a plasma comprising a $C_4F_6$ gas flow from about 14 to about 20 sccm, an argon flow from about 300 to about 500 sccm, a nitrogen flow from about 200 to 400 sccm and a pressure from about 40 to about 60 millitorr; and
    etching the dielectric layer in a plasma comprising a $C_4F_6$ gas flow from about 10 to about 14 sccm, an argon flow from about 280 to about 350 sccm, a nitrogen flow from about 25 to 40 sccm and a pressure from about 80 to about 120 millitorr, wherein the sacrificial light absorbing layer and the dielectric layer etch at an etch rate from about 80 to about 120 times faster than the etch rate of the deep uv resist layer.

2. The method of claim 1 wherein forming and patterning the deep uv resist layer comprises forming a deep uv resist layer and exposing at least a portion of the deep uv resist layer to a light with a wavelength of about 200 nanometers or less.

3. The method of claim 1 wherein forming the deep uv resist layer comprises forming the deep uv resist layer wherein the deep uv resist layer comprises a pre-etch sidewall angle that is substantially the same as a post etch sidewall angle.

4. A method of forming a microelectronic structure comprising:
    forming a deep uv resist layer on a sacrificial light absorbing layer that is disposed on a dielectric layer;
    patterning a portion of the sacrificial light absorbing layer to define a trench;
    forming a bottom width of the trench, wherein the ratio of the bottom width to a top width of the trench is about 1:1 by:

etching the sacrificial light absorbing layer in a plasma generated from a gas comprising a carbon to fluorine ratio that is between about 1:1 to about 2:3; and etching the dielectric layer in a plasma comprising $C_4F_6$ at a gas flow from about 10 to about 15 sccm, an argon flow from about 250 to about 350 sccm and a nitrogen flow from about 20 to about 50 sccm, and a pressure from about 90 to about 110 millitorr.

5. The method of claim 4 further comprising etching the sacrificial light absorbing layer in a plasma comprising $C_4F_6$ gas at a gas flow from about 10 to about 20 sccm, an argon flow from about 400 to about 500 sccm, a nitrogen flow from about 200 to about 400 sccm, a pressure from about 40 to about 60 millitorr and a power from about 1000 to about 4000 Watts.

6. A method of forming a microelectronic structure comprising: forming and patterning a deep uv resist layer on a sacrificial light absorbing layer disposed on a dielectric layer; and etching the sacrificial light absorbing layer and the dielectric layer in a plasma generated from a gas comprising $C_4F_6$, a pressure from about 15 to about 100 millitorr, a power from about 1000 to about 4000 Watts, a $C_4F_6$ gas flow from about 10 to about 50 sccm, an argon flow from about 100 to about 1000 sccm, and a nitrogen flow from about 50 to 100 sccm to form substantially vertical sidewalls in the deep uv resist layer.

7. The method of claim 6 wherein forming and patterning the deep uv resist layer comprises forming a deep uv resist layer and exposing at least a portion of the deep uv resist layer to a light with a wavelength of about 200 nanometers or less.

8. The method of claim 6 wherein etching the sacrificial light absorbing layer and the dielectric layer in the plasma to form substantially vertical sidewalls comprises etching the sacrificial light absorbing layer and the dielectric layer in the plasma to form a polymer on the sidewalls of the deep uv resist layer that substantially prevents the deep uv resist layer from being etched.

9. The method of claim 6 wherein forming the deep uv resist layer comprises forming the deep uv resist layer wherein the deep uv resist layer comprises a pre-etch sidewall angle that is substantially the same as a post etch sidewall angle.

10. The method of claim 6 wherein etching the sacrificial light absorbing and the dielectric layer in a plasma generated from a gas comprising $C_4F_6$ comprises substantially etching the sacrificial light absorbing layer and then substantially etching the underlying dielectric layer.

11. The method of claim 6 wherein etching the sacrificial light absorbing layer and the dielectric layer in the plasma to form a substantially vertical sidewall in the deep uv resist layer comprises etching the sacrificial light absorbing layer and the dielectric layer in the plasma to form a sidewall angle that is between about 86 and about 90 degrees.

12. The method of claim 6 wherein forming and patterning the deep uv resist layer on the sacrificial light absorbing layer and the dielectric layer comprises forming and patterning the deep uv resist layer on the sacrificial light absorbing layer and the dielectric layer, wherein the deep uv resist layer comprises an acrylic polymer.

* * * * *